(12) United States Patent
Peusens et al.

(10) Patent No.: US 7,865,157 B2
(45) Date of Patent: Jan. 4, 2011

(54) CONTROLLABLE MIXER

(75) Inventors: Herbert Peusens, Brigachtal (DE);
Klaus Clemens, Weisweil (DE)

(73) Assignee: Thomson Licensing, Boulogne-Billcourt (FR)

( * ) Notice: Subject to any disclaimer, the term of this patent is extended or adjusted under 35 U.S.C. 154(b) by 24 days.

(21) Appl. No.: 10/577,833

(22) PCT Filed: Sep. 13, 2004

(86) PCT No.: PCT/EP2004/010231

§ 371 (c)(1),
(2), (4) Date: May 1, 2006

(87) PCT Pub. No.: WO2005/048447

PCT Pub. Date: May 26, 2005

(65) Prior Publication Data

US 2007/0042737 A1    Feb. 22, 2007

(30) Foreign Application Priority Data

Nov. 3, 2003  (DE) ................ 103 51 115

(51) Int. Cl.
*H04B 1/18* (2006.01)
(52) U.S. Cl. ............... 455/178.1; 455/195.1; 455/254; 455/232.1
(58) Field of Classification Search ........ 455/232.1, 455/234.1, 333, 334, 234, 178.1, 195.1, 196.1, 455/197.1, 254
See application file for complete search history.

(56) References Cited

U.S. PATENT DOCUMENTS

| | | | |
|---|---|---|---|
| 3,598,902 A | 8/1971 | Tempe et al. | |
| 3,678,183 A | 7/1972 | Montgomery | |
| 5,517,688 A | * 5/1996 | Fajen et al. | ............ 455/333 |
| 5,732,344 A | 3/1998 | Rinderle et al. | |

(Continued)

FOREIGN PATENT DOCUMENTS

CA    1155927 A1    10/1983

(Continued)

OTHER PUBLICATIONS

Datasheet MC13143/D, Rev. 0, 1997 "Advance Information, Ultra Low Power DC-2.4 GHz Linear Mixer" Published by Motorola, Inc. pp. 0-8.

(Continued)

*Primary Examiner*—Edward Urban
*Assistant Examiner*—Christian A Hannon
(74) *Attorney, Agent, or Firm*—Robert D. Shedd; Joseph J. Opalach; Brian J. Cromarty

(57) ABSTRACT

A heterodyne receiver has a mixer with at least one transistor whose operating point can be varied dynamically. The quality of the output signal from the mixer is assessed in order to control the operating point. The operating point is set such that the collector current is increased when the intermodulation interference is high, thus improving the intermodulation resistance. The collector current is reduced when the intermodulation interference is low, thus reducing the transistor noise. Furthermore, the current drawn is reduced in this situation. The circuit and the method are particularly suitable for RF receivers without tunable input filters, and for receivers in which the power consumption must be low.

11 Claims, 4 Drawing Sheets

U.S. PATENT DOCUMENTS

| | | | |
|---|---|---|---|
| 6,282,414 B1 * | 8/2001 | Tsukuda | 455/326 |
| 6,311,048 B1 * | 10/2001 | Loke | 455/245.1 |
| 6,393,260 B1 * | 5/2002 | Murtojarvi et al. | 455/91 |
| 6,498,926 B1 * | 12/2002 | Ciccarelli et al. | 455/240.1 |
| 6,539,216 B1 * | 3/2003 | Oh et al. | 455/326 |
| 6,807,406 B1 * | 10/2004 | Razavi et al. | 455/313 |
| 7,170,951 B1 | 1/2007 | Perthold et al. | |
| 7,595,689 B1 | 9/2009 | Kenington | |

FOREIGN PATENT DOCUMENTS

| | | |
|---|---|---|
| DE | 3038995 A1 | 5/1981 |
| DE | 4430314 C2 | 2/1996 |
| DE | 69911412 T2 | 1/2000 |
| DE | 19927951 A1 | 3/2000 |
| EP | 0999649 | 5/2000 |
| EP | 1193863 | 4/2002 |
| WO | WO 02/084859 | 10/2002 |

OTHER PUBLICATIONS

Search Report Dated Dec. 15, 2004.

* cited by examiner

Intermodulation Intercept Point $IP_3 = f(I_C)$
(3rd order, Output, $Z_S = Z_L = 50\Omega$)
$V_{CE}$ = Parameter, $f$ = 900MHz

CONTROLLABLE MIXER

This application claims the benefit, under 35 U.S.C. §365 of International Application PCT/EP04/010231, filed Sep. 13, 2004, which was published in accordance with PCT Article 21(2) on May 26, 2005 in English and which claims the benefit of German patent application No. 10351115.6, filed Nov. 3, 2003.

Nowadays, receivers for modulated radio-frequency signals are normally in the form of heterodyne receivers. Heterodyne receivers use a mixing stage to which the input signal to be received and an oscillator signal are supplied. The oscillator signal is tunable as a function of the desired frequency which is intended to be received. The mixing stage produces at its output a signal which, for example, is at a lower frequency than the input signal. This frequency is referred to as the intermediate frequency. The input signal, after having been down-mixed to the intermediate frequency, is passed via a bandpass filter and is demodulated in a downstream demodulator stage, in a typical receiver. The mixer is frequently preceded by a controllable amplifier which matches the level of the input signal to the input of the mixer. This measure prevents interference signals being produced by overdriving as a result of non-linearities in the mixing stage. On the other hand, weak input signals are amplified to such an extent that any noise which is added in the mixer has a negative effect on the signal-to-noise ratio. The so-called automatic gain control (AGC) thus ensures that the level of an input signal is matched to a downstream stage.

Furthermore, the signal flowpath upstream of the mixer also frequently contains a tunable bandpass filter, by means of which signals which are adjacent to the useful signal are reduced or suppressed. Suppression or reduction of signals which are adjacent to the useful signal is necessary because intermodulation interference can be caused in the mixer by the proximity of the useful signal and adjacent signals. Furthermore, adjacent signals which are at a higher signal level than the useful signal overdrive the mixer. This is the situation when the controllable amplifier upstream of the mixing stage matches the level of the useful signal to the input of the mixer and at the same time also raises the adjacent signal above the maximum permissible input level of the mixer.

The suppression of signals which are adjacent to a useful signal involves a high degree of circuitry complexity. Bandpass filters upstream of the mixer must be tunable to the tuned frequency. Furthermore, circuits or filters for suppressing adjacent signals must be trimmed at the factory during manufacture of receivers.

It is thus desirable to specify a circuit which has a mixer and in which intermodulation interference is suppressed and the noise behaviour is improved with less complex circuitry and with less need to trim circuit parts during manufacture of receivers. A further aim is to specify a method for controlling a circuit according to the invention for optimization of the immunity to interference.

A mixer such as this and a method such as this are specified in the independent claims. Advantageous refinements and further developments are specified in the dependent claims.

The mixer according to the invention has at least one transistor whose operating point can be set by means of a control signal. An evaluation circuit which is connected via a bandpass filter downstream from the mixer evaluates the signal quality of the output signal. If the intermodulation interference is strong, as occurs, by way of example, when two strong signals are at closely adjacent frequencies, the operating point of the mixer is set such that a high collector current flows. When that collector current is high, the modulation range of the transistor in the mixer increases. The larger modulation range is required for two adjacent strong signals in order to avoid the creation of intermodulation products as a result of non-linearities in the transistor. One embodiment of the mixer makes use of an effect which occurs particularly in bipolar transistors. In this case, the mixing gain of the transistor at the same time decreases when high collector currents occur, which are required for large input signals. When the collector currents are low, the mixing gain rises. The collector current is reduced for small input signals and when the level of the adjacent signals is only low, because the requirements for the modulation range of the transistor are less. At the same time, a higher mixing gain occurs in mixers designed using bipolar transistors, and this is desirable for low input signals. Furthermore, the noise from the transistor is also reduced when the collector currents are low.

During reception of digitally coded signals, in which error correction is possible, the signal quality can be determined in a simple manner by evaluation of the error rate. However, other possible ways to determine the signal quality are also feasible, depending on the type of modulation used and on the input signal, for example analysis of the frequency spectrum of the output signal from the mixing stage.

The invention advantageously allows dynamic matching of the mixer characteristic to the respective reception situation, taking into account signals adjacent to the received signal. This makes it possible to improve the resistance to interference, with less circuitry complexity.

A receiver circuit according to the invention for reception of digital signals does not require a tunable bandpass filter at the input. The digital circuit evaluates the error rate of the received signal, and controls the characteristic of the mixing stage accordingly.

In particular, the circuit and the method are also suitable for mobile appliances or other appliances in which the current drawn should be minimal (intelligent power management). Dynamic adjustment of the characteristic of the transistor in the mixing stage makes it possible to reduce the collector current, and thus the entire current that is drawn, when the reception situation is good and the signal levels are low. The reduced current drawn advantageously makes it possible to reduce the effort for heat dissipation in the circuitry. This also simplifies integration of the mixer and of further components, such as a demodulator, in a single integrated circuit.

In a further development, initial values for operation of the mixer in the receiver are stored in a memory. These initial values include, for example, information about the modulation method, the code rate and/or the symbol rate. The modulation method may, inter alia, comprise phase modulation methods such as BPSK (Binary Phase Shift Keying), QPSK (Quadrature Phase Shift Keying), 8 PSK (8 Phase Shift Keying), or combined phase amplitude modulation methods such as QAM (Quadrature Amplitude Modulation), or else frequency modulation methods such as OFDM (Orthogonal Frequency Division Multiplex).

The initial values are used as the basis for assessment of the current signal quality, and the operating point of the mixer is set so as to achieve at least a desired minimum signal quality. Values for a desired minimum signal quality are advantageously likewise stored in the memory, and the desired minimum signal quality may differ, depending on the modulation method that is used. In this case, values for the desired minimum signal quality are stored for each modulation method. In the case of digitally coded signals, the signal quality is inversely proportional to the error rate.

In a further development, individual optimization routines are stored for each of the different initial values mentioned above. The optimization routines are then used to optimize the setting of the mixer.

The theoretical principle of the invention can be derived from analysis of the non-linear transmission characteristic of a four-pole network (illustrated here only up to the 3rd order):

$$y = a \cdot x + b \cdot x^2 + c \cdot x^3 \qquad (1)$$

A two-tone signal x(t) is passed to the four-pole network with the transfer function as in equation (1):

$$x(t) = \mu \cdot \sin(\overline{\omega}_1 \cdot t) + v \cdot \sin(\overline{\omega}_2 \cdot t) \qquad (2)$$

Equation (3) is obtained by substitution of (2) and (1):

$$y = \frac{1}{2} b \cdot u^2 + \frac{1}{2} b \cdot v^2 \qquad [1]$$

$$+ a \cdot u \cdot \sin(\varpi_1 \cdot t) + a \cdot v \cdot \sin(\varpi_2 \cdot t) + \qquad [2]$$

$$\frac{3}{4} c \cdot u^3 \cdot \sin(\varpi_1 \cdot t) + \frac{3}{4} c \cdot v^3 \cdot \sin(\varpi_2 \cdot t)$$

$$+ \frac{3}{2} c \cdot u \cdot v^2 \cdot \sin(\varpi_1 \cdot t) + \frac{3}{2} c \cdot u^2 \cdot v \cdot \sin(\varpi_2 \cdot t) \qquad [3]$$

$$+ b \cdot u \cdot v \cdot \cos((\varpi_1 - \varpi_2)t) - b \cdot u \cdot v \cdot \cos((\varpi_1 + \varpi_2)t) \qquad [4]$$

$$- \frac{1}{2} b \cdot u^2 \cdot \cos(2\varpi_1 \cdot t) - \frac{1}{2} b \cdot v^2 \cdot \cos(2\varpi_2 \cdot t) \qquad [5]$$

$$- \frac{3}{4} c \cdot u^2 \cdot v \cdot \sin((2\varpi_1 \pm \varpi_2)t) - \frac{3}{4} c \cdot u \cdot v^2 \cdot \sin((\varpi_1 \pm 2\varpi_2)t) \qquad [6]$$

$$- \frac{1}{4} c \cdot u^3 \cdot \sin(3\varpi_1 \cdot t) - \frac{1}{4} c \cdot v^3 \cdot \sin(3\varpi_2 \cdot t) \qquad [7]$$

In the equation above, the equation parts are as follows:

[1] represents the DC component,

[2] represents the linear component,

[3] represents the cross-modulation component,

[4] represents the intermodulation IM2,

[5] represents the square component (twice the frequencies of the signals $\omega_1$ and $\omega_2$);

[6] represents the intermodulation IM3, and

[7] represents the cubic component (three times the frequencies of the signals $\omega_1$ and $\omega_2$).

The factors b and c in (1) can be controlled by suitable control of the mixer characteristic such that the non-linear components IM2 [4] and IM3 [6] are variable. The characteristic, and hence the factors b and c, are controlled via the control input in the circuit according to the invention.

The invention will be described in the following text with reference to the drawing, in which.

Figure 3:
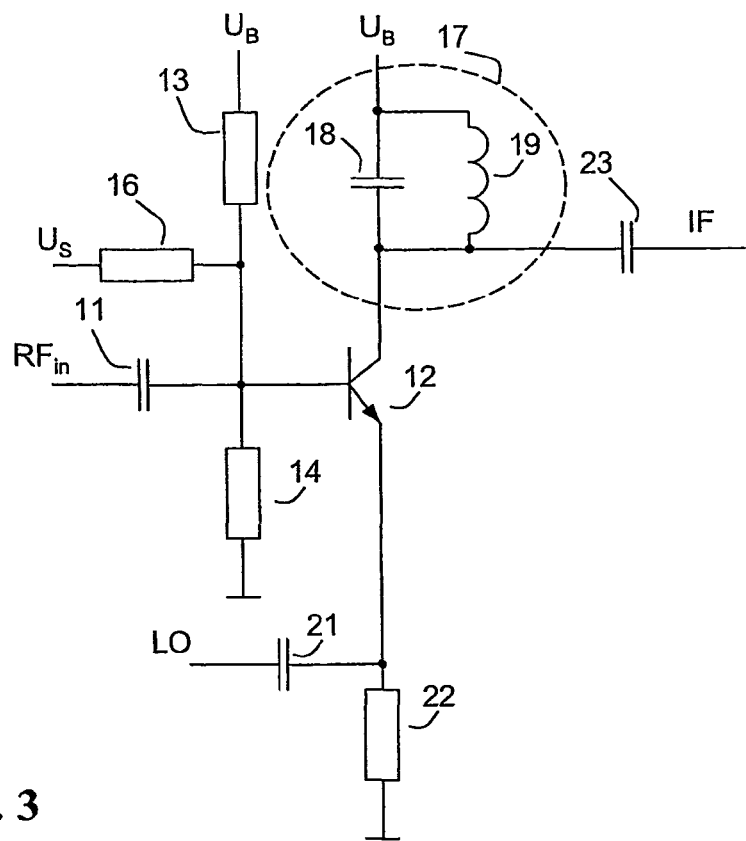
Figure 5:
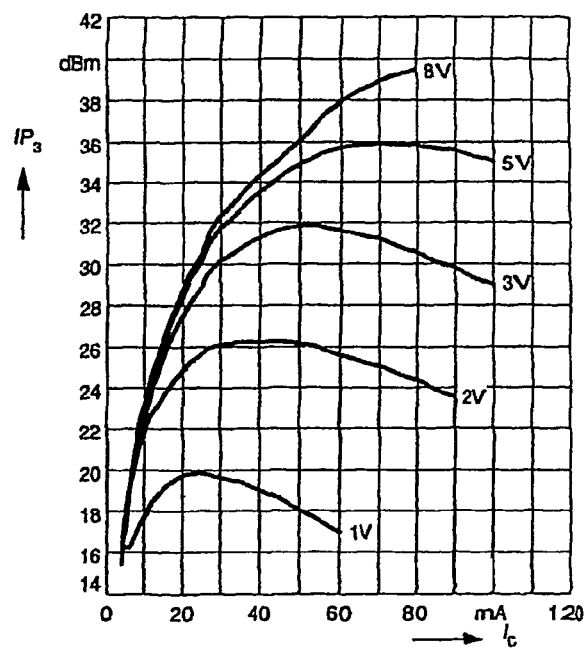
Figure 4:
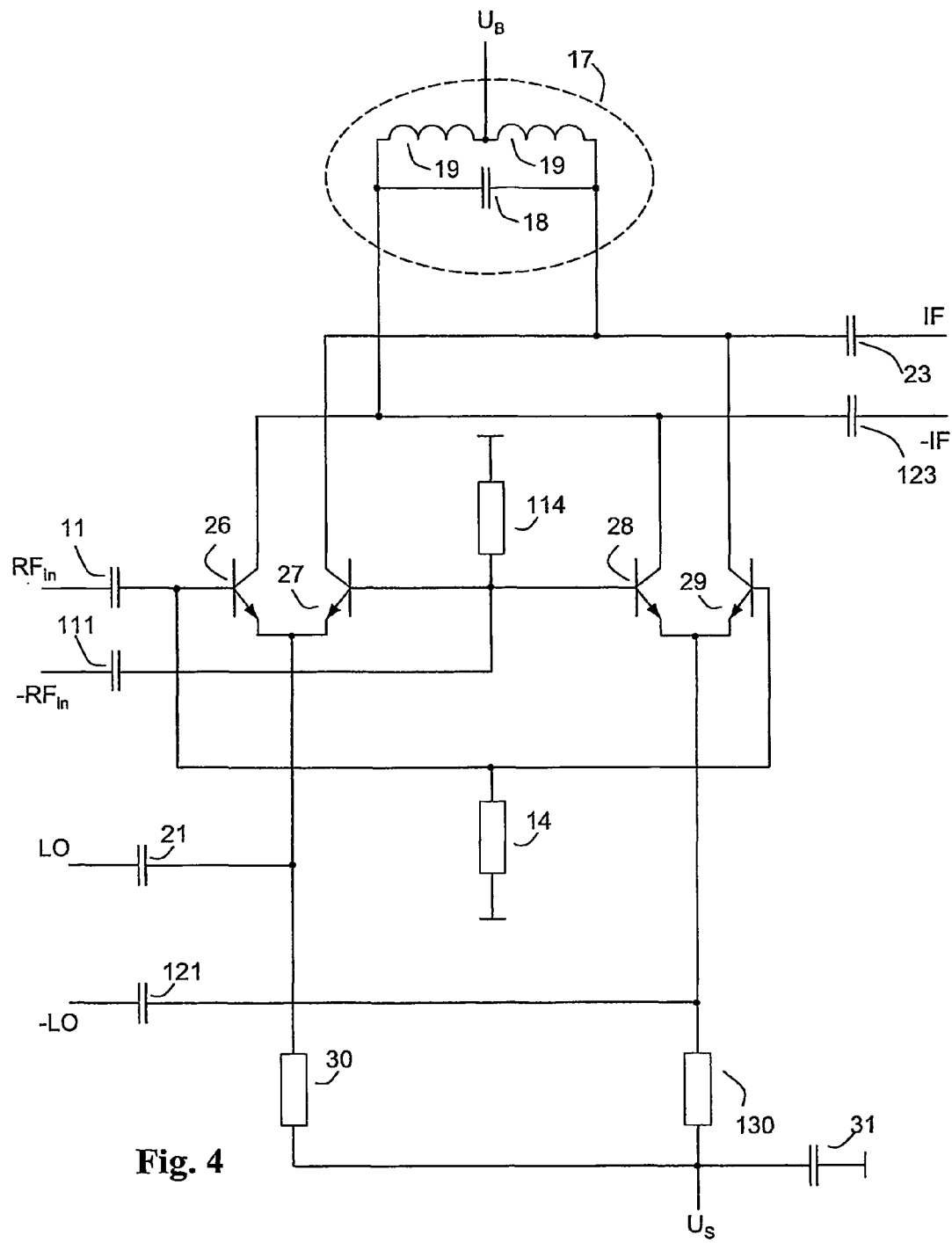
Figure 6:
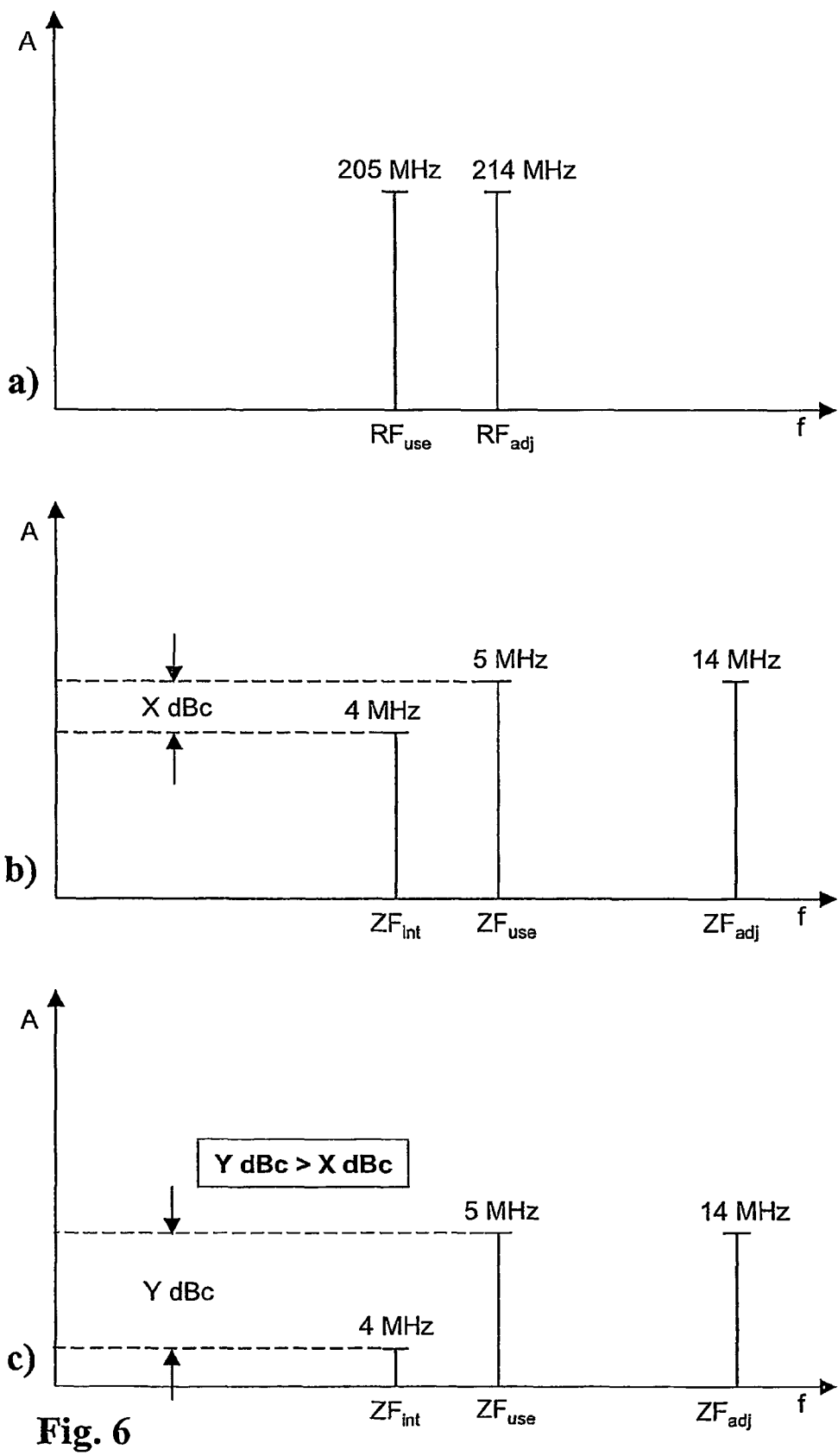

FIG. 3 shows a first schematic illustration of a mixer according to the invention, FIG. 4 shows a second schematic illustration of a mixer according to the invention, FIG. 5 shows an illustration of the intermodulation immunity as a function of the collector current for a transistor, FIG. 6 shows a schematic illustration of the input and output signals of a mixer for different transistor operating points.

Identical or similar elements are provided with the same reference symbols in the figures.

Figure 1:
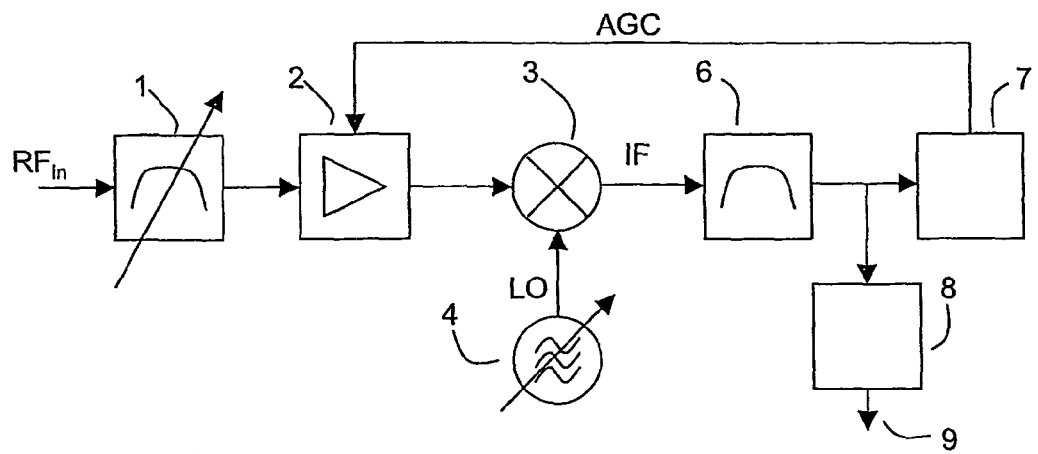
FIG. 1 shows a receiver according to the prior art.

FIG. 1 shows a schematic block diagram of a receiver according to the prior art. An input signal $RF_{in}$ is passed to a tunable bandpass filter 1. The tunable bandpass filter 1 is used for selection of the desired input signal, and for suppression of possible adjacent signals. The signal is passed from the tunable bandpass filter 1 to a variable-gain amplifier 2. The amplifier 2 is connected to a mixer 3. The mixer 3 is also supplied with the signal at a variable frequency from an oscillator 4. An intermediate frequency signal IF is produced at the output of the mixer 3 at a frequency which is lower than the frequency of the input signal $RF_{in}$. The intermediate frequency signal IF is passed to a bandpass filter 6 at a fixed mid-frequency. The intermediate frequency signal is passed from the bandpass filter 6 to a control circuit 7, and to a demodulator 8. The demodulated signal is produced at an output 9 of the demodulator 8 for further processing. The control circuit 7 uses a control signal AGC to control the variable amplifier 2. This control loop ensures that the input signal $RF_{in}$ is applied to the mixer 3 at a suitable signal level. The demodulator 8 demodulates the signal for further processing.

Figure 2:
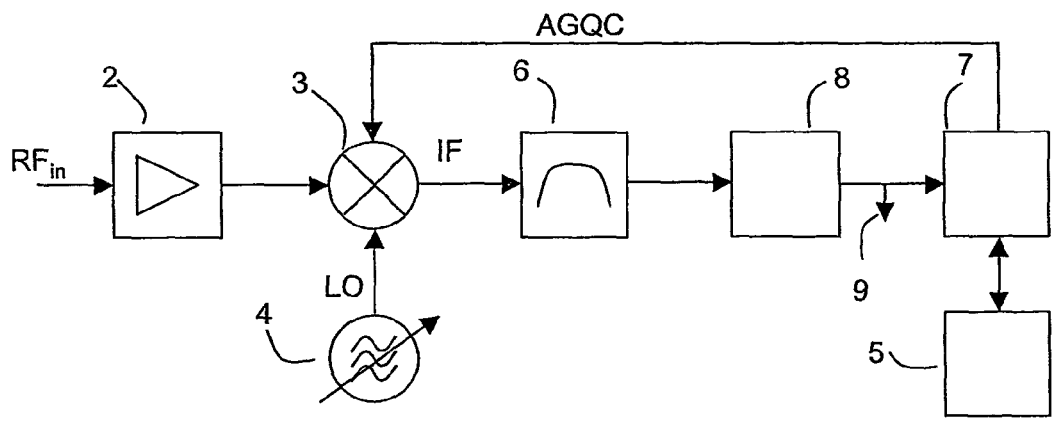
FIG. 2 shows a receiver with a mixer according to the invention.

FIG. 2 shows a schematic block diagram of a receiver with a mixer according to the invention. An input signal $RF_{in}$ is passed to an amplifier 2. The input signal is passed from the amplifier 2 to a mixer 3. The mixer 3 is supplied with the signal at a variable frequency from an oscillator 4. Furthermore, the mixer 3 is supplied with a signal AGQC. An intermediate frequency signal IF is passed from the output of the mixer 3 to a bandpass filter 6 at a fixed mid-frequency. The signal is passed from the bandpass filter 6 to a demodulator 8. The demodulator 8 demodulates the received signal, and produces it at an output 9. The signal at the output 9 is also passed to an evaluation circuit 7, which assesses the signal quality and produces the monitoring signal AGQC as a function of the quality of the received and demodulated signal, which monitoring signal is applied to the mixer 3. A memory 5 is connected to the evaluation circuit for storage and for reading initial values, as well as data obtained during operation.

FIG. 3 shows a first schematic circuit diagram of a mixer according to the invention. A radio-frequency signal $RF_{in}$ is passed via a coupling capacitor 11 to the base connection of a transistor 12. The operating point of the transistor 12 is set via a voltage divider comprising the resistors 13 and 14 at the base connection of the transistor 12. A control voltage $U_S$ is applied to the base connection of the transistor 12 via a resistor 16. The control voltage $U_S$ is derived from the signal AGQC, which is not illustrated in the figure. The operating point of the transistor 12 can be varied by means of the control voltage $U_S$. A capacitor 18 and an inductance 19, connected in parallel, are connected to an operating voltage UB at the collector connection of the transistor 12. The parallel circuit formed by the capacitor 18 and the inductance 19 forms an IF filter 17. The intermediate frequency signal IF is also produced at the collector output of the transistor 12, and is emitted via a coupling capacitor 23. An emitter resistor 22 is connected to earth at the emitter connection of the transistor 12. Furthermore, the emitter connection of the transistor 12 is supplied via a coupling capacitor 21 with the signal LO at a variable frequency from an oscillator which is not illustrated in the figure.

FIG. 4 shows a second schematic illustration of a mixer according to the invention. The mixer in FIG. 4 is suitable for processing balanced signals. The negative mathematical sign in the annotation of the signals indicates that the signals are in antiphase. A signal $RF_{in}$ is passed via a coupling capacitor 11 to the base connections of two transistors 26 and 29. The base connections of the transistors 26 and 29 are connected to earth via a resistor 14. An antiphase signal $-RF_{in}$ is passed via a coupling capacitor 111 to the base connections of two transistors 27 and 28. The base connections of the transistors 27 and 28 are connected to earth via a resistor 114. The transistor pairs 26 and 27 as well as 28 and 29 are connected as differential amplifiers. The emitters of the transistor pairs 26 and 27 as well as 28 and 29 are respectively connected to one another. The connected emitter connections of the transistors 26 and 27 are connected to earth via a resistor 30 and a capacitor 31. The connected emitter connections of the transistor pair 28 and 29 are likewise connected to the capacitor 31 via a resistor 130, and are connected to earth via this capacitor 31. The signal LO from an oscillator is applied to the connected emitter connections of the transistors 26 and 27 via a coupling capacitor 21. The antiphase signal −LO is applied to the connected emitter connections of the transistor pair 28 and 29 via a coupling capacitor 121. A control voltage $U_S$, which is derived from the signal AGQC (which is not illustrated in the figure), is connected between the resistor 30 and the capacitor 31. The operating points of the differential amplifiers formed by the transistor pairs 26 and 27 as well as 28 and 29 can be adjusted by means of the control voltage $U_S$. The collector connections of the transistors 26 and 28 are connected to one another. The collector connections of the transistors 27 and 29 are likewise connected to one another. The intermediate frequency signal IF and the associated antiphase signal −IF can be tapped off at the connected collector connections of the transistors via output capacitors 23 and 123. A parallel circuit formed by an inductance 19 and a capacitor 1B is coupled between the connected collector connections of the transistor pairs 26 and 28 as well as 27 and 29. The circuit formed by the inductance and the capacitor forms an intermediate frequency filter 17. In FIG. 4, the inductance 19 is formed from two series-connected inductance elements, at whose centre connection the supply voltage for the differential amplifiers is fed. Feeding the supply voltage via the centre connection avoids the direct current having any influence on the inductance.

FIG. 5 shows an illustration of the intermodulation resistance IM3 of a transistor, as a function of the collector current. The family of characteristics clearly shows that the intermodulation immunity level is a function of the collector current when the collector/emitter voltage is constant.

By way of example, FIG. 6 shows a simplified schematic illustration of the input and output signals of a mixer for different operating points of a transistor. FIG. 6a shows two inputs signals $RF_{use}$ and $RF_{adj}$ with the same signal levels. The useful signal $RF_{use}$ is at a frequency of 205 MHz. The adjacent signal $RF_{adj}$ is at a frequency of 214 MHz. It is assumed that the mixer oscillator is operating at a frequency of 200 MHz. The intermediate frequency signals $IF_{use}$ and $IF_{adj}$, on the one hand, and the undesirable intermodulation product $IF_{int}$, on the other hand, are produced in the mixer. The useful intermediate frequency signal $IF_{use}$ is at a frequency of 5 MHz (205 MHz−200 MHz), the adjacent intermediate frequency signal is at frequency of 14 MHz (214 MHz−200 MHz), and the interference intermediate frequency signal $IF_{int}$, which is formed by intermodulation, is at a frequency of 4 MHz (200 MHz−(2×205 MHz−214 MHz)). FIG. 6b shows examples of useful, adjacent and interference intermediate frequency signals. The diagram in FIG. 6b is based on the assumption that the mixing transistor is set to a high mixing gain. The three intermediate frequency output signals are at relatively high levels, with the interference intermediate frequency signal $IF_{int}$ being at only a slightly lower level than the useful intermediate frequency signal $IF_{use}$. The intermodulation separation, which is the separation between the useful signal and the interference signal, is, by way of example, assumed to be X dBc, where dBc represents a weighted measurement. FIG. 6c shows the output signals from the mixer when the mixing gain of the mixer transistor is lower. The useful intermediate frequency signal $IF_{use}$ is at a lower level than in FIG. 6b. The interference intermediate frequency signal $IF_{int}$ has not been reduced to the same extent as the useful intermediate frequency signal. The intermodulation separation was increased considerably in comparison to the example in FIG. 6b, and is Y dBc. In this case, Y dBc is greater than X dBc.

The invention claimed is:

1. An RF-circuit including an amplifier and a controllable mixer, the controllable mixer having at least one mixing transistor, wherein the at least one mixing transistor is a bipolar transistor, wherein an oscillator signal and an input signal are supplied to the mixing transistor, wherein the input signal comprises a useful signal and further signals, and wherein the mixer provides an output signal to a demodulator, which demodulator provides a demodulated output signal, wherein a controller is provided, which applies a control signal to the mixing transistor as a function of a signal quality of the demodulated output signal, wherein an operating point of the at least one mixing transistor can be set by means of the control signal, wherein an intermodulation immunity and/or a noise of the mixer can be varied as a function of the operating point of the at least one transistor, wherein a gain of the at least one mixing transistor increases and the intermodulation immunity decreases when the operating point is set such that a collector current is reduced, and wherein the gain of the at least one mixing transistor decreases and the intermodulation immunity increases when the operating point is set such that the collector current is increased, and wherein a controllable portion of an overall gain of the RF-circuit is determined by the operating point of the at least one mixing transistor.

2. The RF-circuit according to claim 1, wherein, in addition to a demodulator which is connected downstream from the mixer, an evaluation circuit is provided, for assessment of the signal quality of the demodulated output signal.

3. The RF-circuit according to claim 2, wherein the evaluation circuit assesses an error rate of a digitally coded signal.

4. The RF-circuit according to claim 1, wherein a memory is provided for recording initial values, on the basis of which the signal quality can be assessed and optimized.

5. The RF-circuit according to claim 4, wherein the initial values comprise information about a desired minimum signal quality, a symbol rate, a code rate, and/or a modulation method, and wherein optimization routines for reception optimization can be selected as a function of the initial values.

6. The RF-circuit of claim 1, wherein the controllable portion of the overall gain of the RF-circuit is exclusively determined by setting the operating point of the at least one mixing transistor.

7. A method of controlling a mixer in an RF circuit further comprising an amplifier and a demodulator, wherein the mixer has at least one mixing transistor, wherein the at least one mixing transistor is a bipolar transistor, to which mixing transistor an oscillator signal and an input signal are supplied, wherein the input signal comprises a useful signal and further signals, and wherein the mixer provides an output signal to a demodulator, which demodulator provides a demodulated output signal, the method comprising the following steps:
assessing a signal quality of the demodulated output signal;
setting an operating point of the at least one mixing transistor as a function of the quality of the demodulated output signal, wherein an intermodulation immunity and/or an noise of the at least one transistor are set by means of the operating point of the at least one mixing transistor, wherein a gain of the at least one mixing transistor increases and the intermodulation immunity decreases when the operating point is set such that a collector current is reduced, and wherein the gain of the at least one mixing transistor decreases and the intermodulation immunity increases when the operating point is set such that the collector current is increased, and setting a controllable portion of an overall gain of the RF-circuit by setting the operating point of the at least one mixing transistor.

8. The method according to claim 7, wherein an error rate of a digitally coded signal is evaluated in order to assess the signal quality.

9. The method according to claim 7, wherein initial values which are stored at the start are selected in order to assess the signal quality and in order to set the operating point of the transistor.

10. The method according to claim 9, wherein different initial values and/or optimization routines are selected for different modulation methods, code rates and/or symbol rates.

11. The method of claim 7, wherein the controllable portion of the overall gain of the RF-circuit is exclusively determined by setting the operating point of the at least one mixing transistor.

* * * * *